United States Patent
Sim

(10) Patent No.: US 8,541,284 B2
(45) Date of Patent: Sep. 24, 2013

(54) METHOD OF MANUFACTURING STRING FLOATING GATES WITH AIR GAPS IN BETWEEN

(75) Inventor: Jae-Hwang Sim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 13/302,080

(22) Filed: Nov. 22, 2011

(65) Prior Publication Data
US 2012/0156855 A1    Jun. 21, 2012

(30) Foreign Application Priority Data
Dec. 16, 2010  (KR) .................. 10-2010-0129161

(51) Int. Cl.
*H01L 21/8242* (2006.01)
*H01L 21/76* (2006.01)

(52) U.S. Cl.
USPC ........... 438/421; 438/128; 438/199; 438/201; 438/211; 438/257; 438/587; 438/593; 257/905; 257/E21.646; 257/E27.084

(58) Field of Classification Search
USPC .................. 438/128, 199, 201, 211, 257, 421, 438/587, 593, FOR. 189, FOR. 212, FOR. 225; 257/905–908, E21.646, E27.084, E23.013
See application file for complete search history.

(56) References Cited

U.S. PATENT DOCUMENTS

| | | | |
|---|---|---|---|
| 7,629,213 B2 | 12/2009 | Cho et al. | |
| 2010/0093165 A1 | 4/2010 | Bae et al. | |
| 2010/0237398 A1* | 9/2010 | Kamigaichi et al. | 257/316 |
| 2010/0295113 A1* | 11/2010 | Kang et al. | 257/316 |

FOREIGN PATENT DOCUMENTS

KR    10-2006-0120977 A    11/2006

* cited by examiner

*Primary Examiner* — Thanh V Pham
(74) *Attorney, Agent, or Firm* — Lee & Morse, P.C.

(57) ABSTRACT

A method of manufacturing a semiconductor device includes forming a plurality of strings spaced a first distance from each other, each string including first preliminary gate structures spaced a second distance, smaller than the first distance, between second preliminary gate structures, forming a first insulation layer to cover the first and second preliminary gate structures, forming an insulation layer structure to fill a space between the strings, forming a sacrificial layer pattern to partially fill spaces between first and second preliminary gate structures, removing a portion of the first insulation layer not covered by the sacrificial layer pattern to form a first insulation layer pattern, reacting portions of the first and second preliminary gate structures not covered by the first insulation layer pattern with a conductive layer to form gate structures, and forming a capping layer on the gate structures to form air gaps between the gate structures.

20 Claims, 20 Drawing Sheets

METHOD OF MANUFACTURING STRING FLOATING GATES WITH AIR GAPS IN BETWEEN

CROSS-REFERENCE TO RELATED APPLICATIONS

This application claims priority under 35 USC §119 to Korean Patent Application No. 10-2010-0129161 filed on Dec. 16, 2010 in the Korean Intellectual Property Office (KIPO), the contents of which are herein incorporated by reference in their entirety.

BACKGROUND

1. Field

Example embodiments relate to methods of manufacturing semiconductor devices. More particularly, example embodiments relate to methods of manufacturing semiconductor devices having air gaps.

2. Description of the Related Art

As semiconductor devices have been highly integrated, a threshold voltage may be changed due to a parasitic capacitance between word lines. Thus, a method of manufacturing a semiconductor device in which the parasitic capacitance may be reduced is needed.

SUMMARY

Example embodiments provide a method of manufacturing a semiconductor device having gate structures spaced apart from each other at a different distance and including air gaps.

According to example embodiments, there is provided a method of manufacturing a semiconductor device. The method may include forming a plurality of preliminary strings spaced apart a first distance from each other on a substrate, each of the preliminary strings including a plurality of first preliminary gate structures spaced apart a second distance from each other between second preliminary gate structures, the first distance being greater than the second distance, forming a first insulation layer on the substrate to cover the first and second preliminary gate structures, forming an insulation layer structure on the first insulation layer, such that the insulation layer structure fills a space between the preliminary strings, forming a sacrificial layer pattern on the first insulation layer, such that the sacrificial layer pattern partially fills spaces between adjacent ones of the first and second preliminary gate structures, removing a portion of the first insulation layer not covered by the sacrificial layer pattern to form a first insulation layer pattern, reacting portions of the first and second preliminary gate structures not covered by the first insulation layer pattern with a conductive layer to form first and second gate structures, respectively, and forming a capping layer on the first and second gate structures, such that air gaps are formed between the first and second gate structures.

Forming the insulation layer structure may include forming a second insulation layer on the first insulation layer, such that the second insulation layer covers top surfaces of the first and second preliminary gate structures and a sidewall of the space between the preliminary strings, partially removing the second insulation layer to form a second insulation layer pattern covering the top surfaces of the first preliminary gate structures and partially covering the top surfaces of the second preliminary gate structures, such that a spacer is formed on the sidewall of the space between the preliminary strings, forming an insulating interlayer on the second insulation layer pattern and the spacer, such that the space between the preliminary strings is filled, and planarizing upper portions of the insulating interlayer and the second insulation layer pattern.

The method may further include, prior to partially removing the second insulation layer, forming a third insulation layer on the second insulation layer.

Partially removing the second insulation layer may include forming a mask on the third insulation layer, the mask overlapping portions of the second preliminary gate structures and the first preliminary gate structures, and removing the second and third insulation layers using the mask as an etching mask.

Forming the second insulation layer may include using a material having gap filling characteristics lower than that of the third insulation layer.

Forming the second insulation layer may include using PEOX or MTO, and forming the third insulation layer may include using HTO.

The method may further include, prior to forming the insulating interlayer, conformally and sequentially forming a buffer layer and an etch stop layer on the second insulation layer pattern.

Forming the buffer layer may include using an oxide, and forming the etch stop layer may include using silicon nitride.

Planarizing the upper portions of the insulating interlayer and the second insulation layer pattern may include planarizing the insulating interlayer and the etch stop layer until the second insulation layer pattern is exposed, and removing the second insulation layer pattern, the insulating interlayer, the etch stop layer, the buffer layer, and the first insulation layer until top surfaces of the first preliminary gate structures are exposed.

Removing the second insulation layer pattern, the insulating interlayer, the etch stop layer, the buffer layer, and the first insulation layer may include providing ammonia gas onto the substrate, and performing a heat treatment on the substrate.

Forming the sacrificial layer pattern may include forming a sacrificial layer on the first insulation layer and the insulation layer structure to fill spaces between the preliminary gate structures, and partially removing the sacrificial layer until a top surface of the insulation layer structure and sidewalls of the preliminary gate structures are exposed.

Forming the first insulation layer pattern may include providing ammonia gas onto the substrate, and performing a heat treatment on the substrate.

Forming the first and second gate structures may include forming a metal layer on the preliminary gate structures, the sacrificial layer pattern, the first insulation layer pattern, and the insulation layer structure, and performing a heat treatment on the substrate to react the preliminary gate structures with the metal layer.

The method may further include forming a tunnel insulation layer on the substrate, each first preliminary gate structure including a first floating gate, a first dielectric layer pattern, and a first preliminary control gate sequentially stacked on the tunnel insulation layer, and each second preliminary gate structure includes a second floating gate, a second dielectric layer pattern, and a second preliminary control gate sequentially stacked on the tunnel insulation layer, wherein the first and second preliminary control gates include polysilicon, and wherein portions of the first and second preliminary control gates are silicidated by the heat treatment.

The method may further include, after forming the first and second gate structures, removing the sacrificial layer pattern.

According to example embodiments, there is provided a method of manufacturing a semiconductor device. The method may include forming a plurality of preliminary strings spaced apart a first distance from each other on a substrate, each of the preliminary strings including a plurality of first preliminary gate structures spaced a second distance from each other between second preliminary gate structures, the first distance being greater than the second distance, forming a first insulation layer on lower sidewalls and bottoms of openings between adjacent ones of the first and second preliminary gate structures, forming an insulation layer structure on the first insulation layer between the preliminary strings, forming a conductive layer directly on upper portions of the first and second preliminary gate structures to form first and second gate structures, respectively, the upper portions of the first and second preliminary gate structures being exposed by the first insulation layer, and forming a capping layer on the first and second gate structures, such that air gaps are formed within each string between adjacent ones of the first and second gate structures.

Forming the first insulation layer on lower sidewalls may include conformally forming the first insulation layer on the first and second preliminary gate structures, forming a sacrificial layer pattern on the first insulation layer in each preliminary string, such that the sacrificial layer pattern partially fills spaces between adjacent ones of the first and second preliminary gate structures within each preliminary string, and removing upper portions of the first insulation layer within each string, such that a top part of each first and second preliminary gate structures is exposed.

Forming the insulation layer structure may include completely filling a space between the preliminary strings.

Forming the conductive layer may include conformally depositing a metal layer on the upper portions of the first and second preliminary gate structures including silicon, such that the upper portions of the first and second preliminary gate structures undergo a silicidation process.

The method may further include, before forming the capping layer, removing the first insulating layer from the first and second gate structures.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
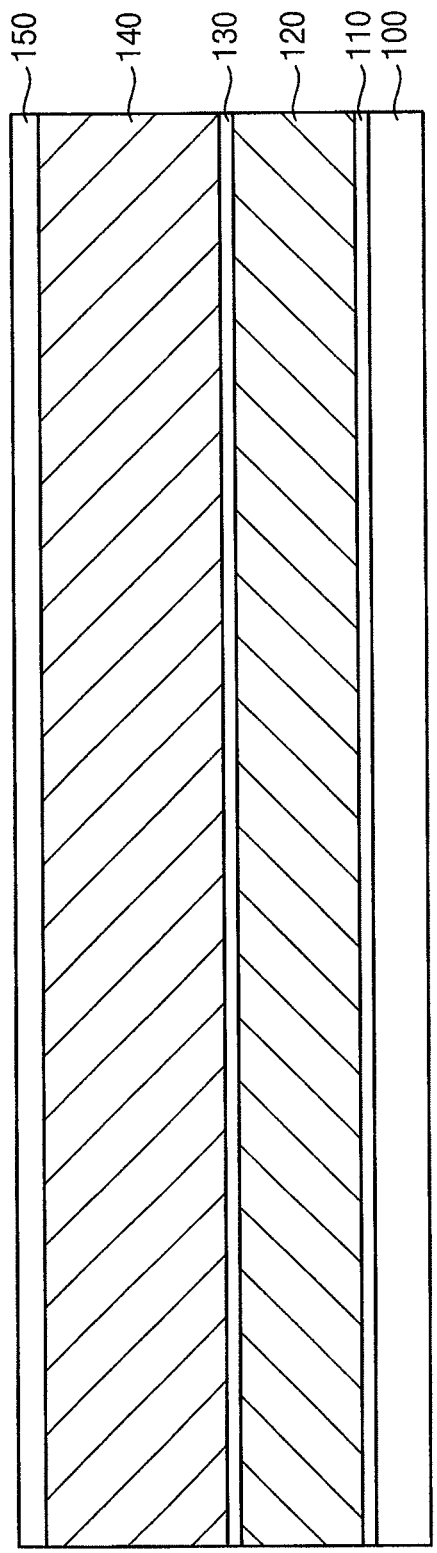
FIGS. 1 to 18 illustrate cross-sectional views of stages in a method of manufacturing a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element (or layer) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will be understood that when a layer is referred to as being "connected to" or "coupled to" another layer, it can be directly connected or coupled to the other layer or intervening layers may be present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an example embodiment of a method for manufacturing semiconductor device will be explained in detail with reference to FIGS. 1-18. FIGS. 1 to 18 are cross-sectional views of stages in a method of manufacturing a semiconductor device in accordance with example embodiments.

Referring to FIG. 1, a tunnel insulation layer 110, a floating gate layer 120, a dielectric layer 130, a preliminary control gate layer 140, and a gate mask layer 150 may be sequentially formed on a substrate 100.

The substrate 100 may be a semiconductor substrate, e.g., a silicon substrate, a germanium substrate, a silicon-germanium substrate, a silicon-on-insulator (SOI) substrate, a germanium-on-insulator (GOI) substrate, etc. The substrate 100 may further include a well region (not shown) doped with p-type or n-type impurities.

The substrate 100 may be divided into an active region and a field region by a plurality of isolation layers (not shown), each of which may extend in a first direction and may be arranged, e.g., spaced apart from an adjacent isolation layer, in a second direction substantially perpendicular to the first direction. That is, a region in which the isolation layers are formed may be referred to as the field region, and a region in which the isolation layers are not formed may be referred to as the active region. In example embodiments, the tunnel insulation layer 110 and the floating gate layer 120 may be formed only on the active region, and the dielectric layer 130, the preliminary control gate layer 140, and the gate mask layer 150 may be formed not only on the active region but also on the field region. FIGS. 1 to 18 are cross-sectional views of the semiconductor devices in the active region, and illustrate a cell region for forming memory cells.

The tunnel insulation layer 110 may be formed using an oxide, e.g., silicon oxide, a nitride, e.g., silicon nitride, silicon oxide doped with impurities, or a low-k dielectric material.

The floating gate layer 120 may be formed using doped polysilicon, a metal having a high work function, e.g., tungsten, titanium, cobalt, and/or nickel, etc.

The dielectric layer 130 may be formed using an oxide or a nitride, and for example, may have a multi-layered structure of oxide/nitride/oxide (ONO). Alternatively, the dielectric layer 130 may be formed using a metal oxide having a high dielectric constant, so that the semiconductor device may have a high capacitance and improved leakage current characteristics. The high-k metal oxide may include hafnium oxide, titanium oxide, tantalum oxide, zirconium oxide, aluminum oxide, etc.

The preliminary control gate layer 140 may be formed using doped polysilicon, a metal, a metal nitride, a metal silicide, etc. In example embodiments, the preliminary control gate layer 140 may be formed to include doped polysilicon at least at an upper portion thereof.

The gate mask layer 150 may be formed using silicon oxide, silicon nitride, or silicon oxynitride.

Alternatively, a charge trapping layer 120, a blocking layer 130, and a gate electrode layer 140 may be sequentially formed on the tunnel insulation layer 110 instead of the floating gate layer 120, the dielectric layer 130, and the preliminary control gate layer 140, respectively. The charge trapping layer 120 may be formed using a nitride, e.g., silicon nitride, or a metal oxide, e.g., hafnium oxide. The blocking layer 130 may be formed using silicon oxide or a high-k metal oxide, e.g., hafnium oxide, titanium oxide, tantalum oxide, zirconium oxide, aluminum oxide, etc. The gate electrode layer 140 may be formed using doped polysilicon, a metal, a metal nitride, a metal silicide, etc. In example embodiments, the gate electrode layer 140 may be formed to include doped polysilicon at least at an upper portion thereof.

Hereinafter, only the structure including the floating gate layer 120, the dielectric layer 130, and the preliminary control gate layer 140 sequentially stacked on the tunnel insulation layer 110 is illustrated.

Figure 2:
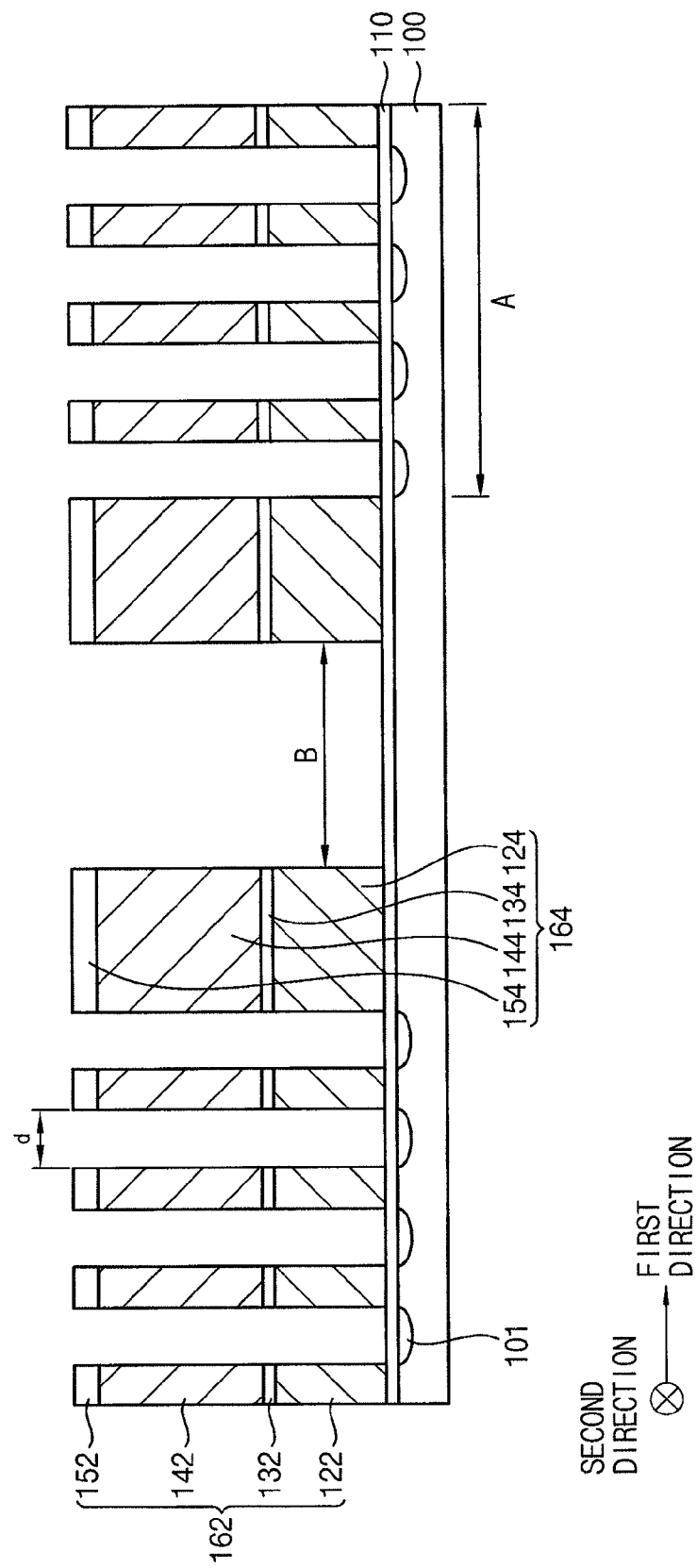

Referring to FIG. 2, the gate mask layer 150, the preliminary control gate layer 140, the dielectric layer 130, and the floating gate layer 120 may be sequentially etched by a photolithography process to form first and second preliminary gate structures 162 and 164 on the substrate 100.

In example embodiments, a plurality of first preliminary gate structures 162, e.g., sixteen (16) or thirty-two (32) first preliminary gate structures 162, may be formed between two second preliminary gate structures 164. Thus, the first preliminary gate structures 162 and the second preliminary gate structures 164 may define a preliminary string. For example, each of regions A in FIG. 2 represents a partial preliminary string having a distance d between adjacent preliminary gate structures therein. However, the number of the first preliminary gate structure 162 and the number of the second preliminary gate structure 164 may not be limited thereto. A distance between adjacent preliminary gate structures within each string, i.e., a distance between adjacent first preliminary gate structures 162 or a distance between an outermost first preliminary gate structure 162 and an adjacent second preliminary gate structure 164, may be smaller than a distance between adjacent strings, i.e., a distance between adjacent second preliminary gate structure 164 illustrated as region B in FIG. 2. That is, a distance between preliminary gate structures 162 and 164 in one preliminary string may be smaller than a distance between the preliminary strings.

Each first preliminary gate structure 162 may include a first floating gate 122, a first dielectric layer pattern 132, a first preliminary control gate 142, and a first gate mask 152 sequentially stacked on the tunnel insulation layer 110, and each second preliminary gate structure 164 may include a second floating gate 124, a second dielectric layer pattern 134, a second preliminary control gate 144, and a second gate mask 154 sequentially stacked on the tunnel insulation layer 110. In example embodiments, each of the dielectric layer patterns 132 and 134, each of the preliminary control gates 142 and 144, and each of the gate masks 152 and 154 may extend in the second direction.

Figure 3:
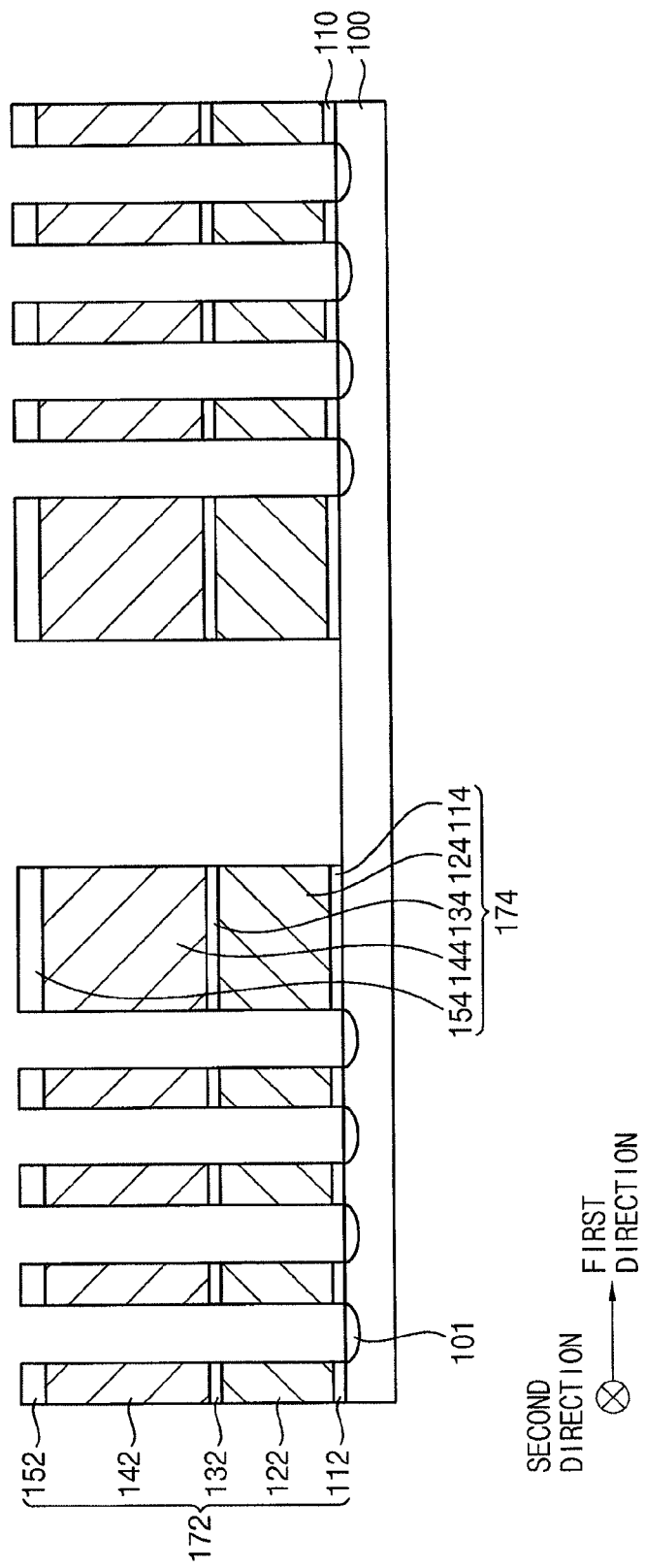

Alternatively, referring to FIG. 3, in the photolithography process, the tunnel insulation layer 110 may be also patterned. Thus, a third preliminary gate structure 172 including a first tunnel insulation layer pattern 112, the first floating gate 122, the first dielectric layer pattern 132, the first preliminary control gate 142, and the first gate mask 152 sequentially stacked on the substrate 100 may be formed. Additionally, a fourth preliminary gate structure 174 including a second tunnel insulation layer pattern 114, the second floating gate 124, the second dielectric layer pattern 134, the second preliminary control gate 144, and the second gate mask 154 sequentially stacked on the substrate 100 may be formed.

Hereinafter, only the case in which the first and second preliminary gate structures 162 and 164 are formed is illustrated.

Referring to FIG. 2 again, after forming a photoresist pattern (not shown) covering a space between the second gate structures 164, first impurities may be implanted into the substrate 100 using the photoresist pattern and the preliminary gate structures 162 and 164 as an ion implantation mask. Thus, first impurity regions 101 may be formed at upper portions of the substrate 100 adjacent to the first preliminary gate structures 162. Alternatively, without forming the photoresist pattern, first impurities may be implanted into the substrate 100 using only the preliminary gate structures 162 and 164 as an ion implantation mask. In this case, an upper portion of the substrate 100 between the second preliminary gate structures 164 may be also doped with the first impurities to form a second impurity region (not shown).

Figure 4:
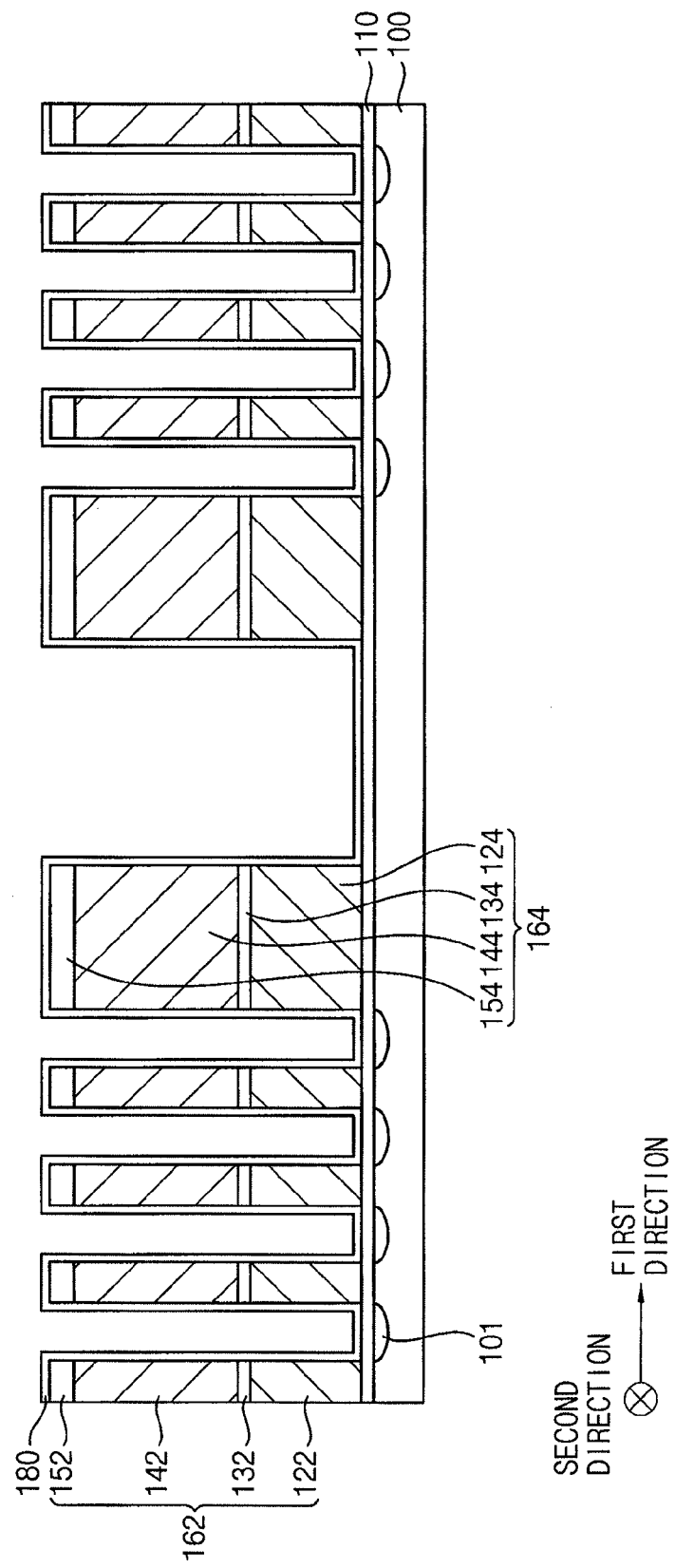

Referring to FIG. 4, a first insulation layer 180 may be formed on the substrate 100 to, e.g., conformally, cover the preliminary gate structures 162 and 164.

The first insulation layer 180 may be formed, e.g., using silicon oxide, silicon nitride or silicon oxynitride, by a chemical vapor deposition (CVD) process, an atomic layer deposition (ALD) process, a physical vapor deposition (PVD) process, etc. In example embodiments, the first insulation layer 180 may be formed using high temperature oxide (HTO) or middle temperature oxide (MTO) to have a thickness of about 50 Å.

Figure 5:
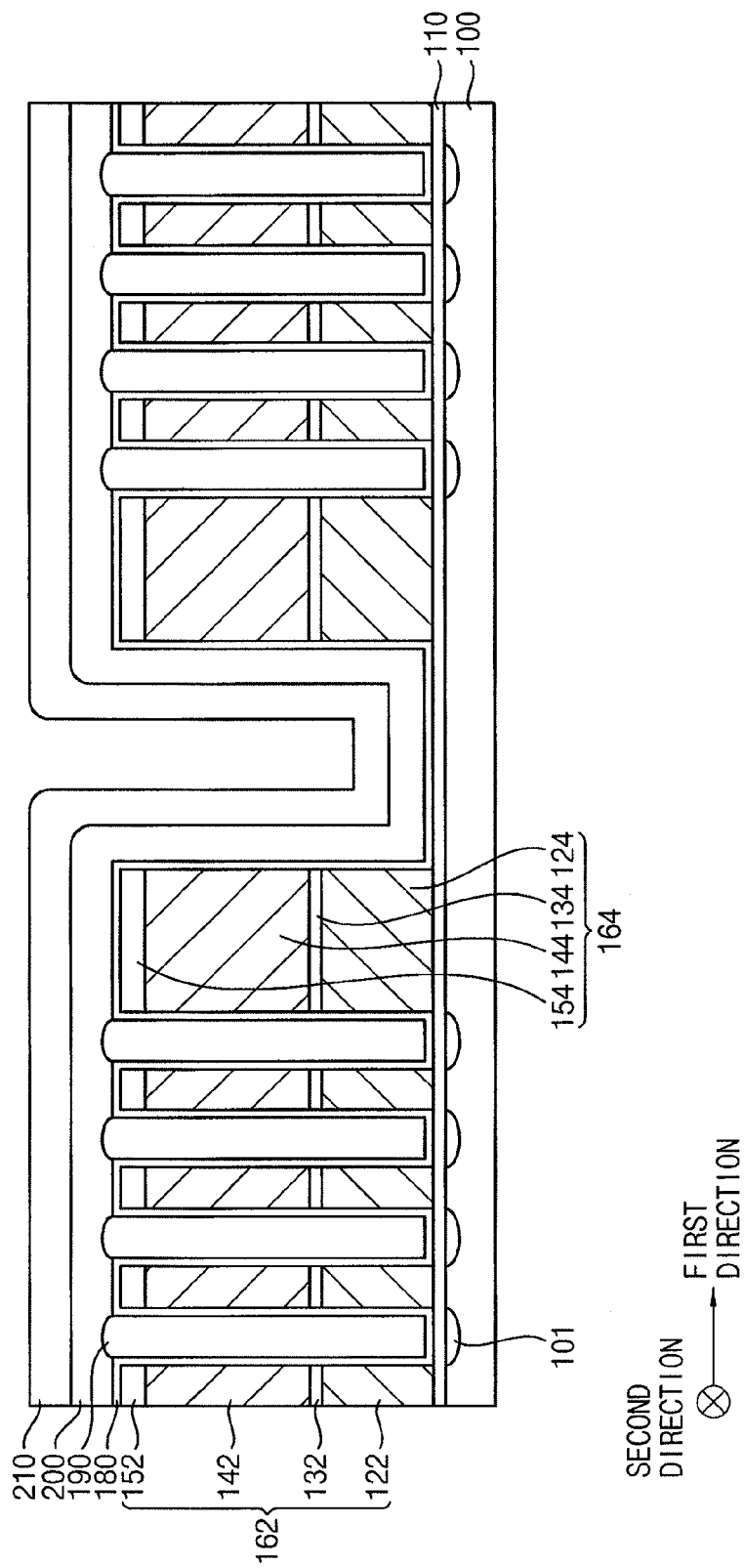

Referring to FIG. 5, second and third insulation layers 200 and 210 may be sequentially formed on the first insulation layer 180, and first air gaps 190 may be formed between the preliminary gate structures 162 and 164 in each preliminary string.

In example embodiments, the second insulation layer 200 may be formed using a silicon oxide, e.g., plasma enhanced oxide (PEOX) or MTO by a CVD process, a plasma enhanced chemical vapor deposition (PECVD) process, or a low present chemical vapor deposition (LPCVD) process. The second insulation layer 200 may be formed under a poor step coverage condition, so that the second insulation layer 200 may not completely fill the spaces between the preliminary gate structures 162 and 164, i.e., spaces between adjacent first preliminary gate structures 162 and between the outermost first preliminary gate structure 162 and an adjacent second preliminary gate structure 164. Thus, each first air gap 190 may be defined by the first and second insulation layers 180 and 200, and may be formed between the preliminary gate structures 162 and 164.

In example embodiments, the third insulation layer 210 may be formed using a silicon oxide, e.g., HTO by a CVD process, a PECVD process, or a LPCVD process. The third insulation layer 210 may be formed using a material having gap filling characteristics better than that of the second insulation layer 200, and may be formed conformally on the second insulation layer 200. Thus, the third insulation layer 210 may be formed to have a sufficient thickness between the preliminary strings. That is, the third insulation layer 210 may be formed over a portion of the first insulation layer 180 on a sidewall of each second preliminary gate structure 164, even though the second insulation layer 200 may not be formed to have a sufficient thickness thereon.

Figure 6:
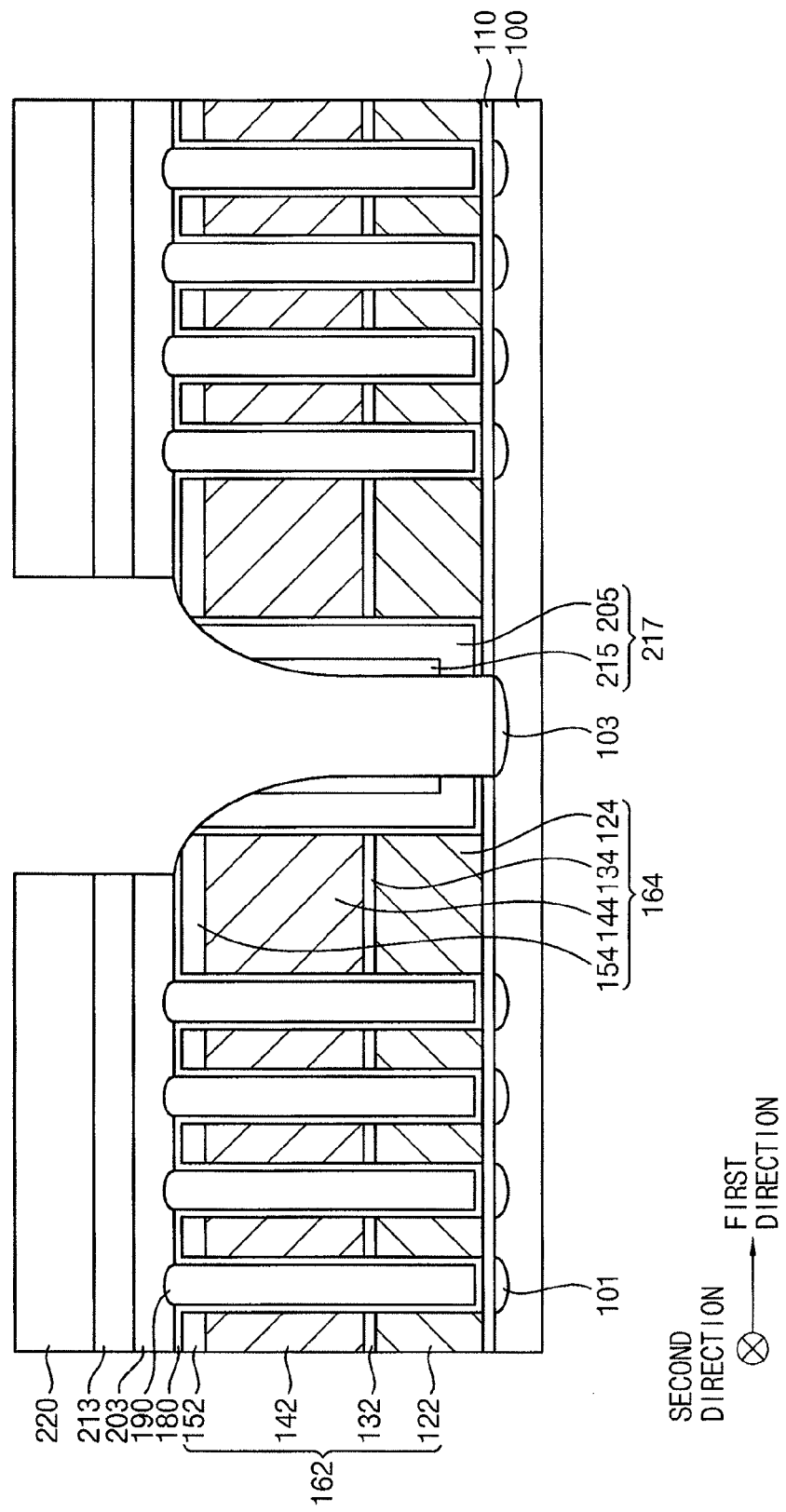

Referring to FIG. 6, a mask 220 may be formed on the third insulation layer 210, so the third insulation layer 210, the second insulation layer 200, the first insulation layer 180, and the tunnel insulation layer 110 may be partially removed using the mask 220 as an etching mask to expose a top surface of the substrate 100, e.g., between preliminary strings. The mask 220 may be formed to overlap the first preliminary gate structures 162 and a portion of each second preliminary gate structure 164. In example embodiments, the mask 220 may be formed using a photoresist pattern.

By the etching process, the second and third insulation layers 200 and 210 remaining on top surfaces of the preliminary gate structures 162 and 164 may be transformed into second and third insulation layer patterns 203 and 213, respectively, and the second and third insulation layers 200 and 210 remaining on a sidewall of each second preliminary gate structure 164 may be transformed into first and second spacers 205 and 215, respectively. The first and second spacers 205 and 215 on a sidewall of a second preliminary gate structure 164 may be defined as a spacer structure 217. It is noted that while a portion of the first insulation layer 180, i.e., on the second gate mask 154, and a portion of the second gate mask 154 may be removed during the etching process, the second preliminary control gate 144 may not be exposed.

Second impurities may be implanted into an exposed upper portion of the substrate 100 to form a second impurity region 103. That is, the second impurity region 103 may be between preliminary strings, e.g., between adjacent second preliminary gate structures 164 of respective adjacent preliminary strings.

Figure 7:
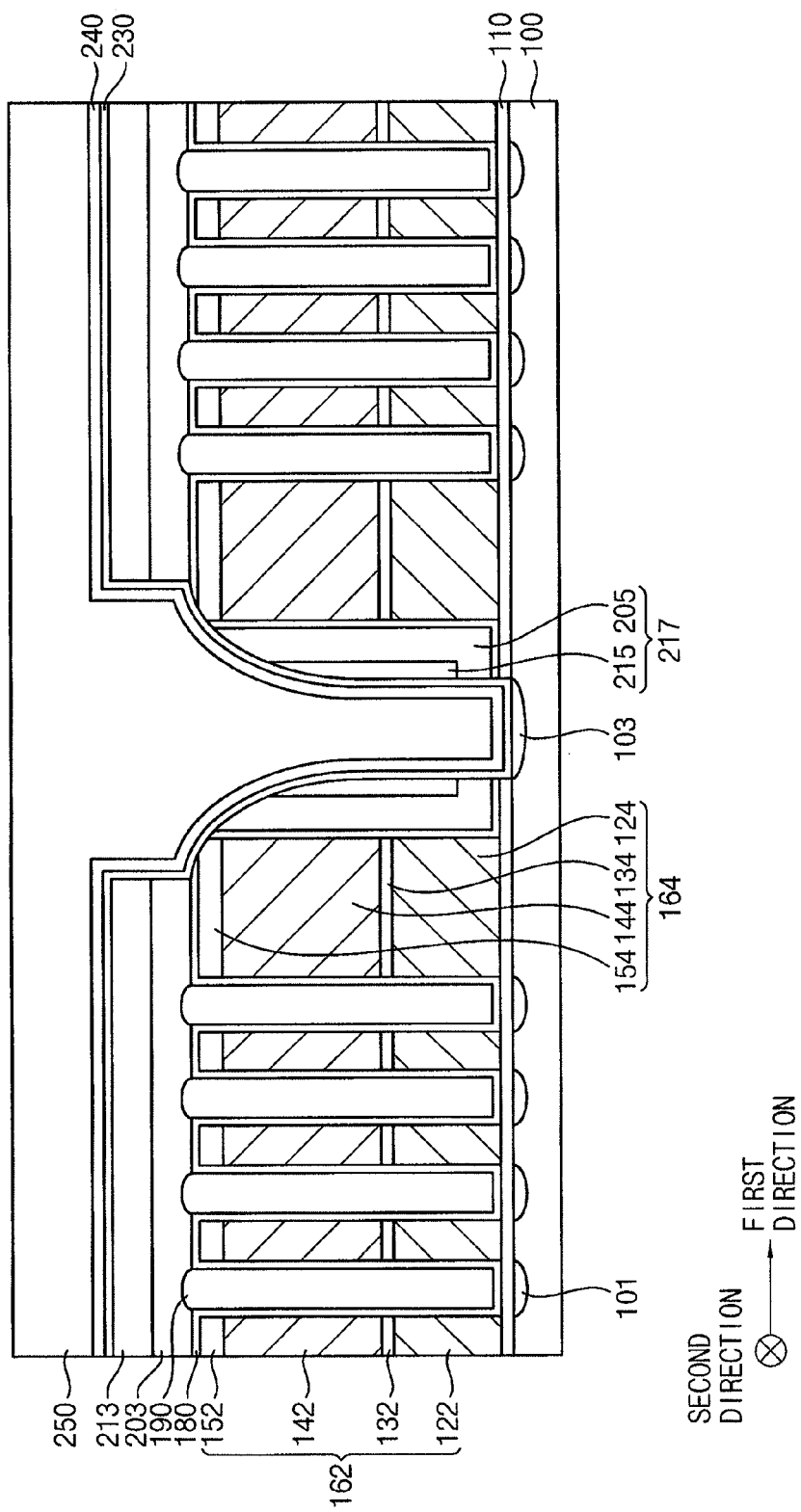

Referring to FIG. 7, a buffer layer 230 and an etch stop layer 240 may be sequentially formed on the second and third insulation layer patterns 203 and 213, the second preliminary gate structures 164, the spacer structures 217, and the substrate 100, and a first insulating interlayer 250 may be formed on the etch stop layer 240 to sufficiently fill a space between the spacer structures 217.

In example embodiments, the buffer layer 230 may be formed using an oxide, and the etch stop layer 240 may be formed using silicon nitride. The first insulating interlayer 250 may be formed using an oxide, e.g., borophospho silicate glass (BPSG), undoped silicate glass (USG), spin on glass (SOG), etc. The buffer layer 230 may relieve the stress between the substrate 100 including silicon or silicon oxide and the etch stop layer 240 including silicon nitride.

Figure 8:
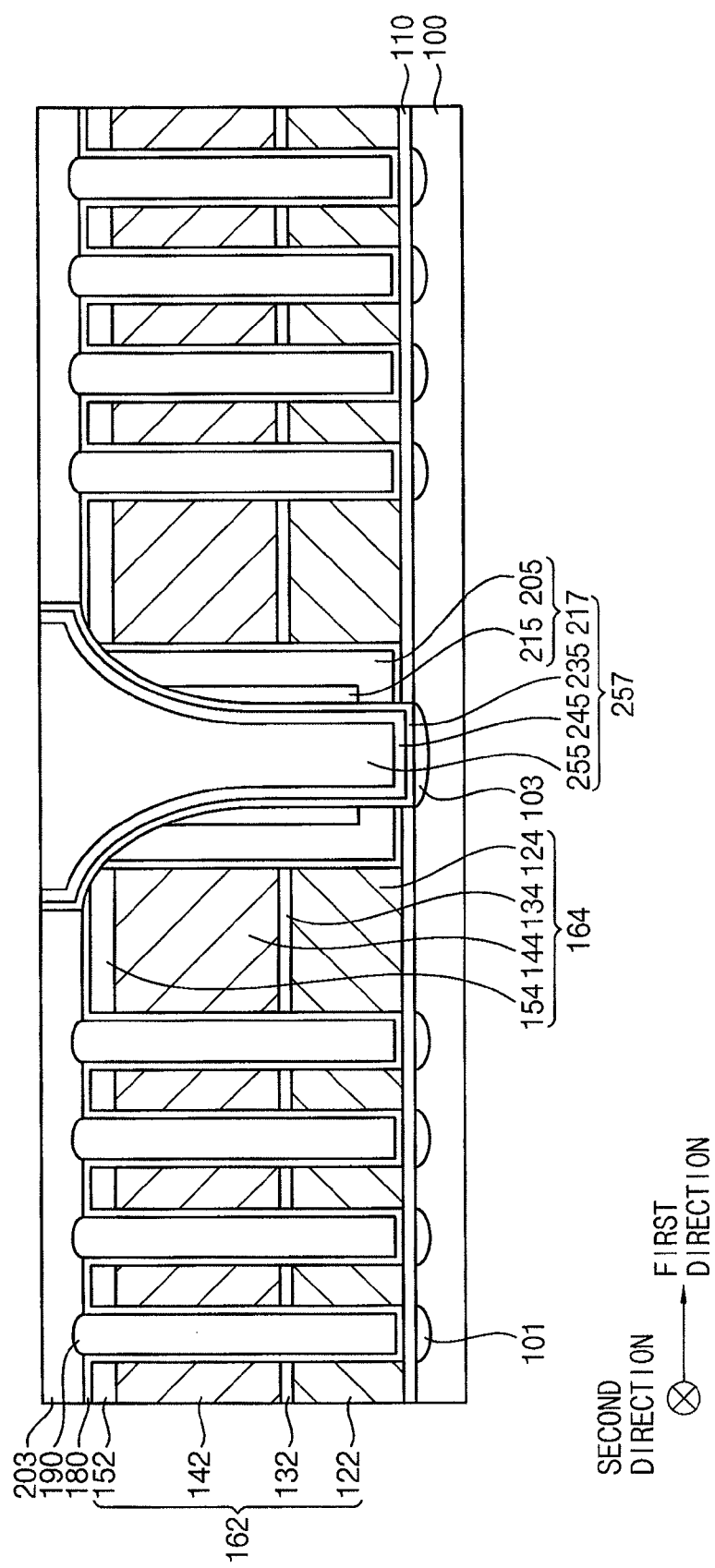

Referring to FIG. 8, the first insulating interlayer 250, the etch stop layer 240, the buffer layer 230, and the third insulation layer pattern 213 may be planarized until a top surface of the second insulation layer pattern 203 is exposed.

Particularly, the first insulating interlayer 250 may be planarized using the etch stop layer 240 as a planarization endpoint. The planarization process may be performed by a chemical mechanical polishing (CMP) process and/or an etch back process. In detail, portions of the first insulating interlayer 250, the etch stop layer 240, the buffer layer 230, and the third insulation layer pattern 213 may be removed, so a first insulating interlayer pattern 255, an etch stop layer pattern 245, and a buffer layer pattern 235 may be formed. The first insulating interlayer pattern 255, the etch stop layer pattern 245, and the buffer layer pattern 235 together with the spacer structures 217 may define an insulation layer structure 257.

Figure 9:
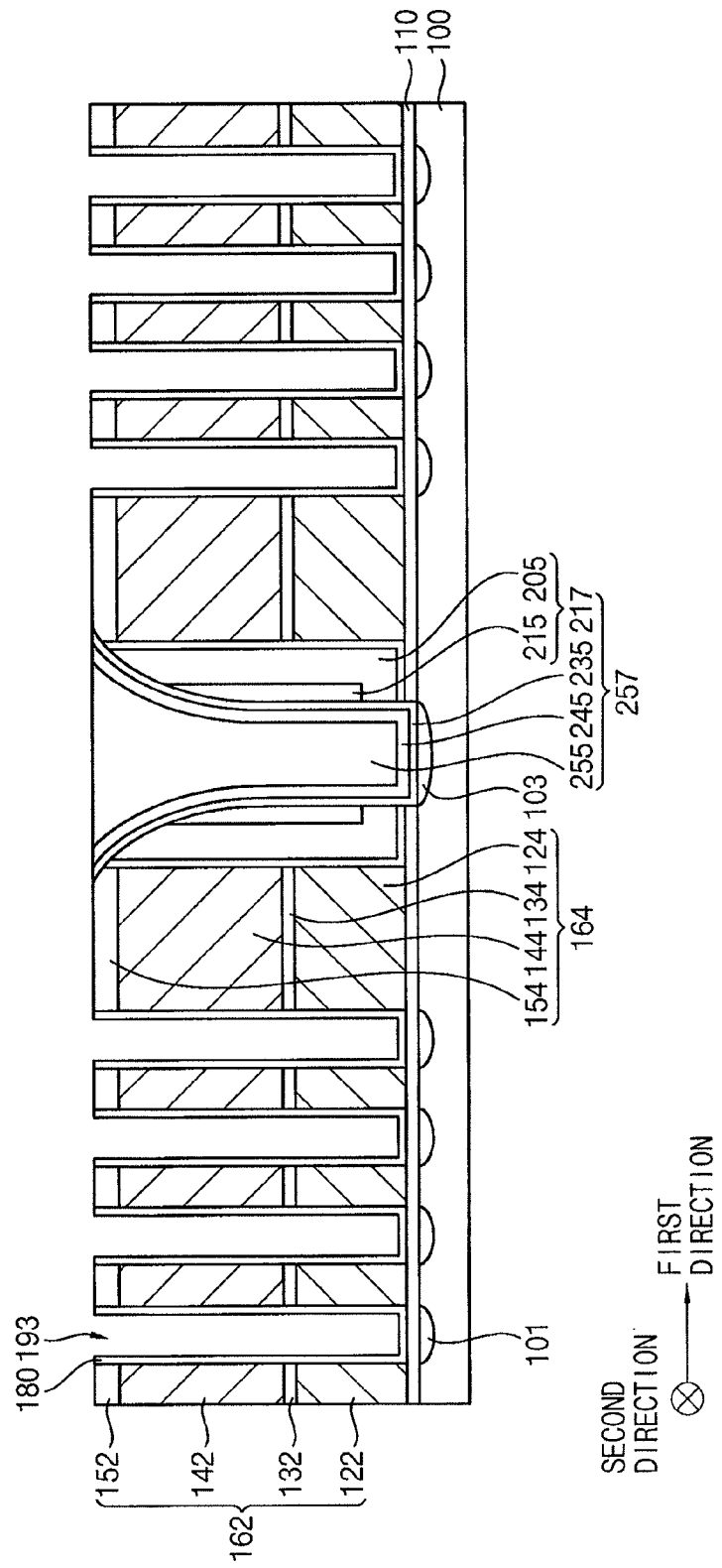

Referring to FIG. 9, the second insulation layer pattern 203 may be removed to expose the first air gaps 190.

In example embodiments, ammonia gas may be provided onto the substrate 100 and a heat treatment may be performed thereon to remove the second insulation layer pattern 203. A portion of the first insulation layer 180 on the preliminary gate structures 162 and 164 may be removed to expose the gate masks 152 and 154. Upper portions of the first insulating interlayer pattern 255, the etch stop layer pattern 245, and the buffer layer pattern 235 may be also removed so that the first insulating interlayer pattern 255, the etch stop layer pattern 245, and the buffer layer pattern 235 may have top surfaces coplanar with those of the gate masks 152 and 154.

As the first air gaps 190 are exposed, first openings 193 may be defined between the preliminary gate structures 162 and 164. For example, a first opening 193 may be defined between every two adjacent first preliminary gate structures 162 and between an outermost first preliminary gate structure 162 and an adjacent second preliminary gate structure 164.

Figure 10:
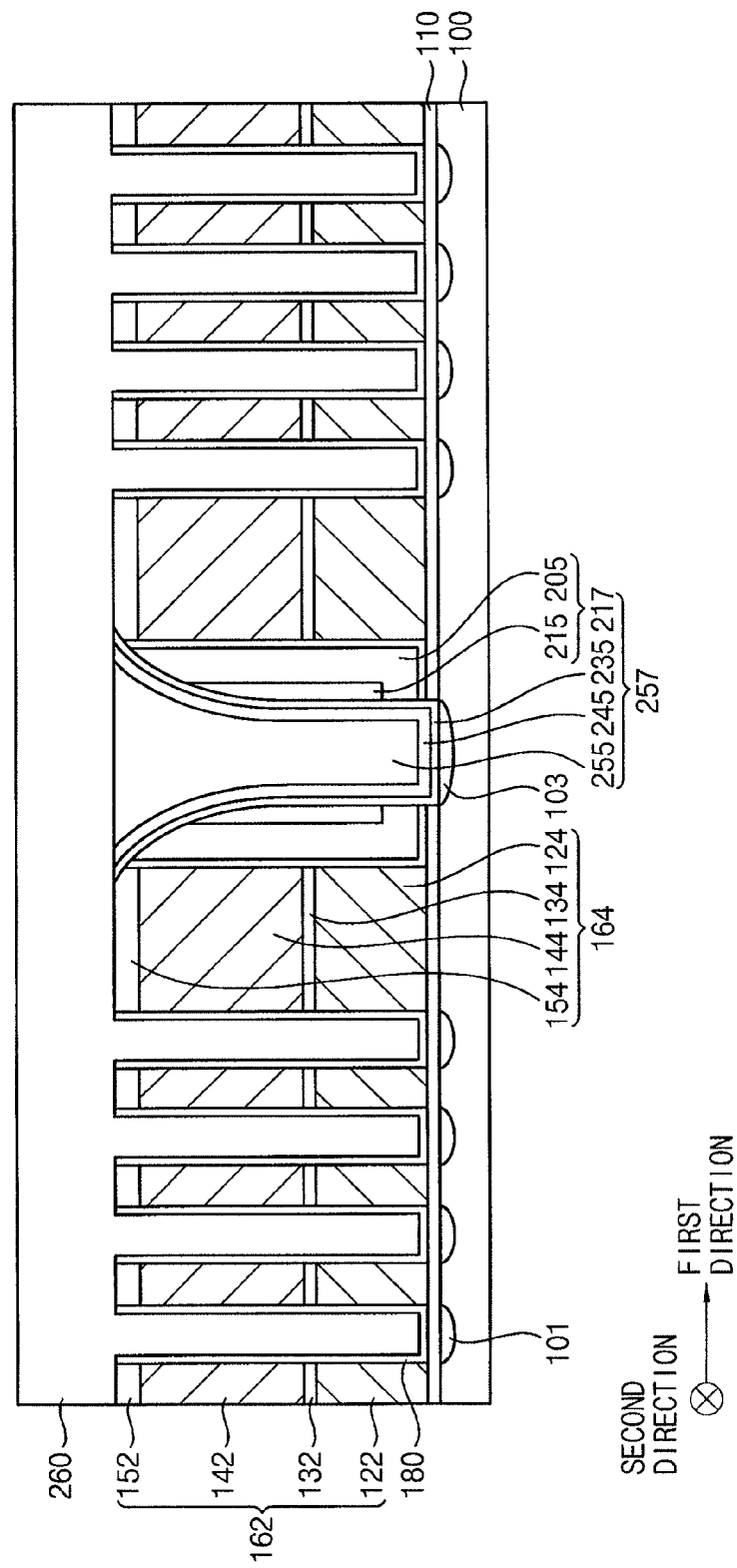

Referring to FIG. 10, a sacrificial layer 260 may be formed on the insulation layer structure 257, the preliminary gate structures 162 and 164, and the first insulation layer 180 to fill spaces between the preliminary gate structures 162 and 164. In other words, the sacrificial layer 260 may fill, e.g., completely fill, the first openings 193.

The sacrificial layer 260 may be formed by a CVD process, an ALD process, a PVD process, etc. In example embodiments, the sacrificial layer 260 may be formed using carbon-based spin on hardmask (C—SOH) or silicon-based spin on hardmask (Si—SOH).

Figure 11:
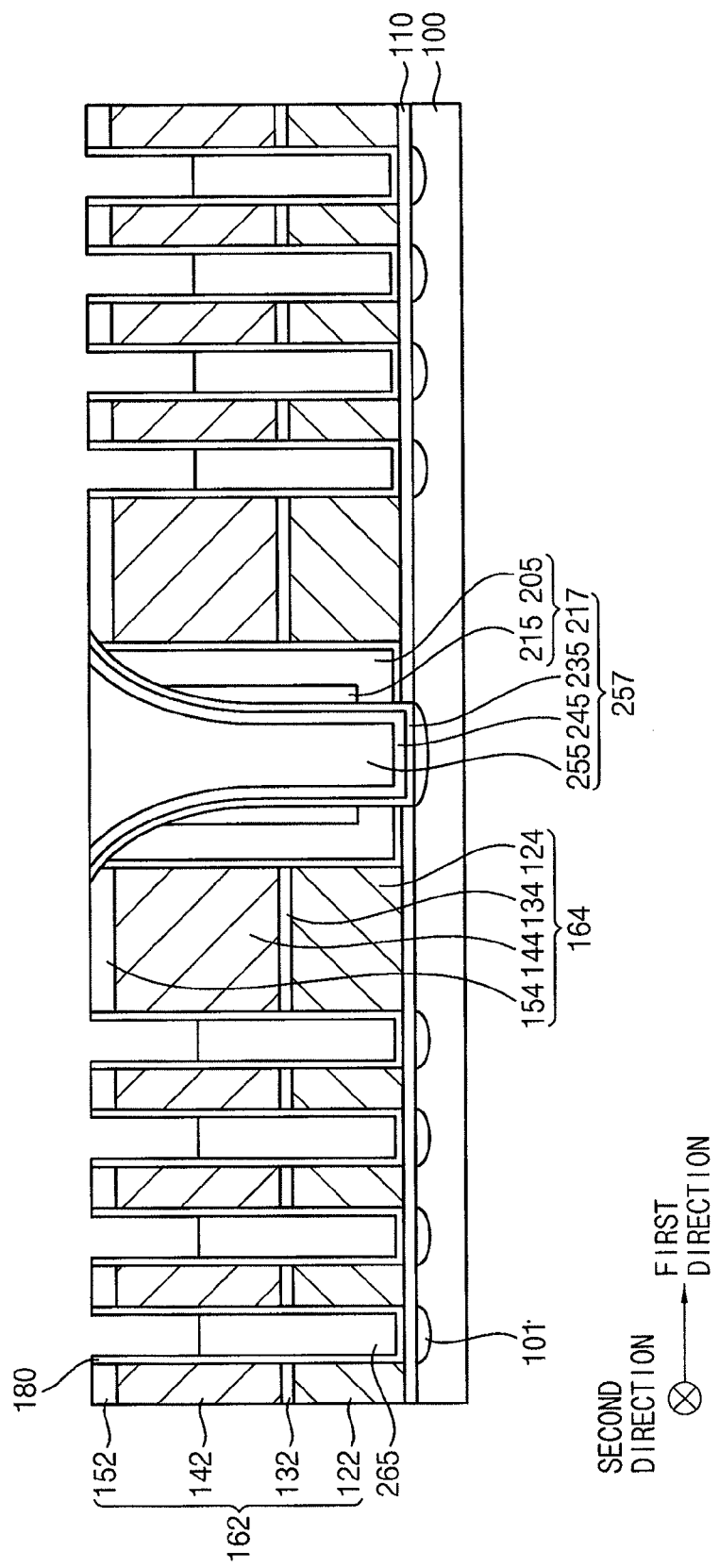

Referring to FIG. 11, an upper portion of the sacrificial layer 260 may be removed to form a sacrificial layer pattern 265 in the first openings 193. Thus, a top surface of the insulation layer structure 257 and a portion of the first insulation layer 180 on sidewalls of upper portions of the preliminary gate structures 162 and 164 may be exposed. In example embodiments, the upper portion of the sacrificial layer 260 may be removed by an etch back process.

Figure 12:
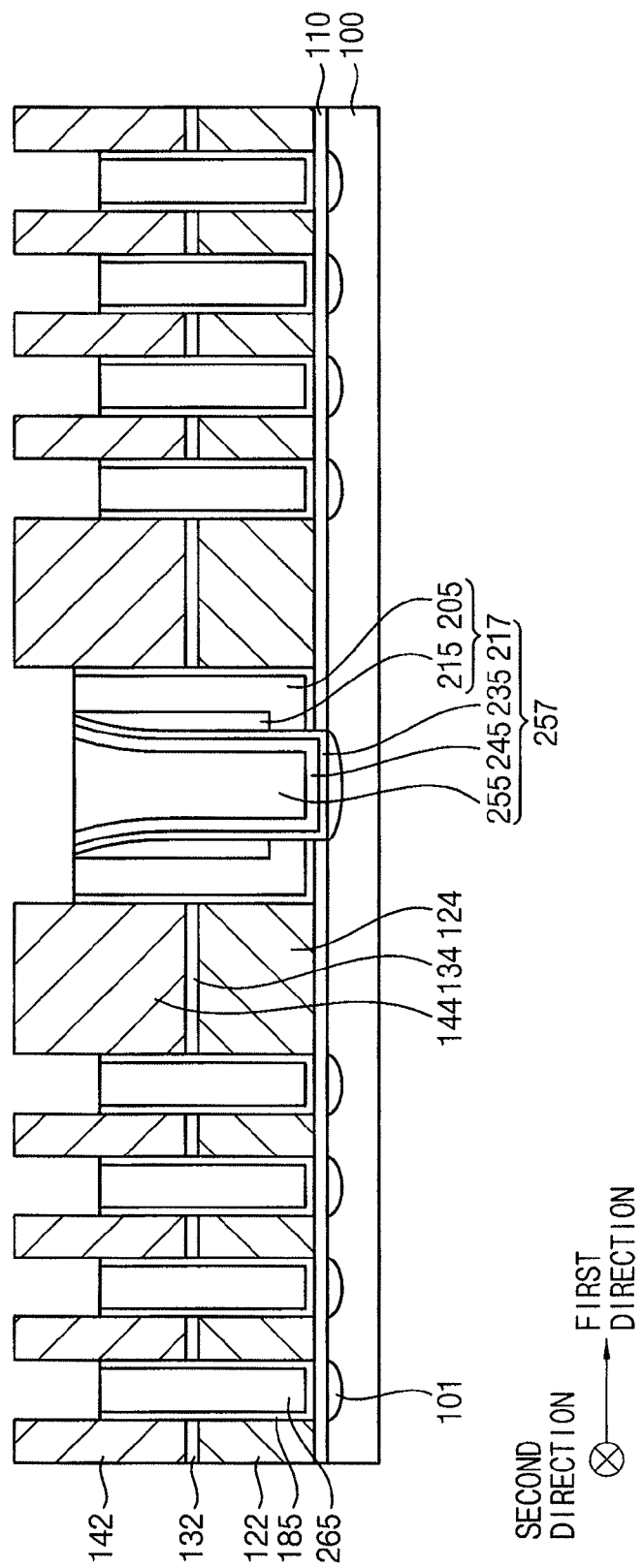

Referring to FIG. 12, the exposed portion of the first insulation layer 180 may be removed from upper portions of the openings 193 to form a first insulation layer pattern 185. Thus, sidewalls of upper portions of the preliminary gate structures 162 and 164 may be exposed. In example embodiments, upper portions of the preliminary control gates 142 and 144 of the preliminary gate structures 162 and 164 may be exposed.

In example embodiments, ammonia gas may be provided onto the substrate 100 and a heat treatment may be performed thereon to partially remove the first insulation layer 180. An upper portion of the insulation layer structure 257 may be also removed.

Figure 13:
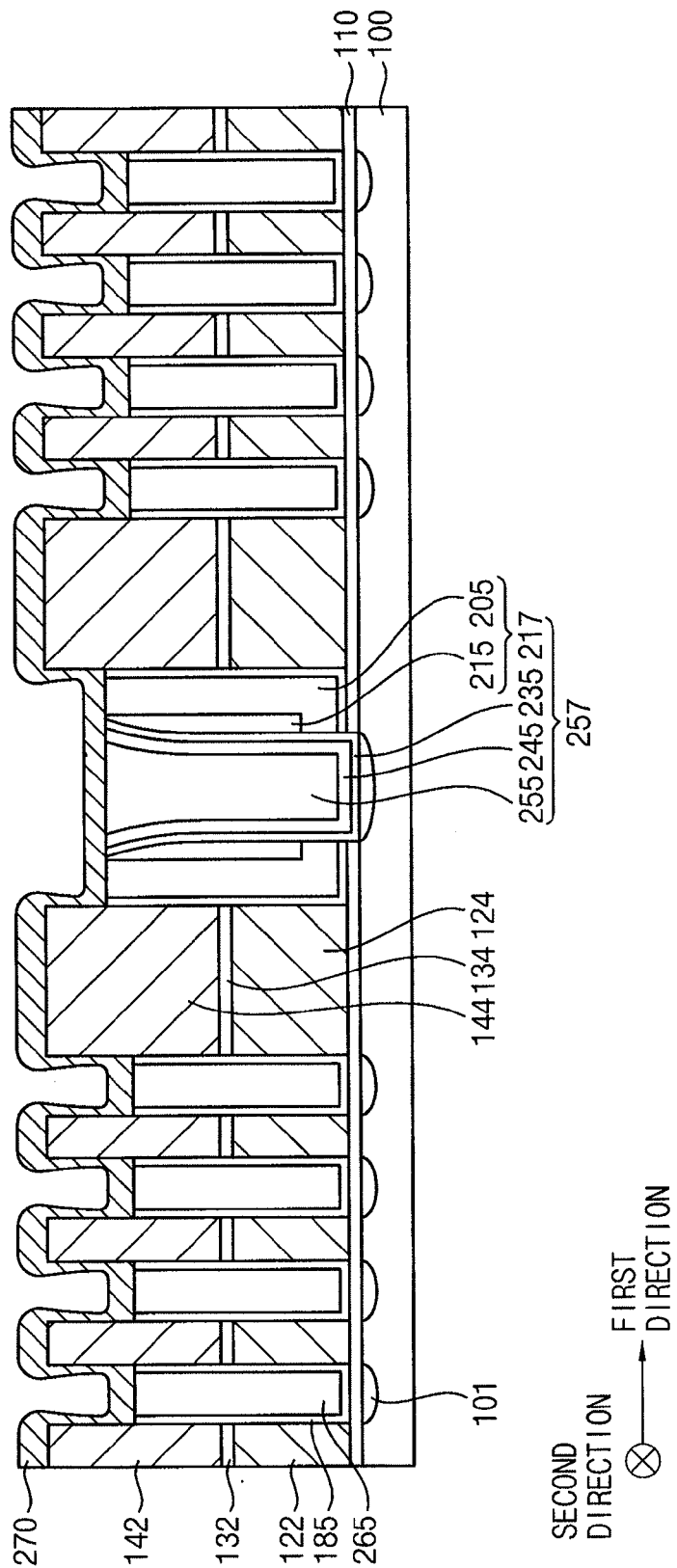

Referring to FIG. 13, a first conductive layer 270 may be formed, e.g., conformally, on the exposed upper portions of the preliminary control gates 142 and 144, the insulation layer structure 257, the sacrificial layer pattern 265, and the first insulation layer pattern 185. In example embodiments, the first conductive layer 270 may be formed using a metal, e.g., cobalt, nickel, etc. by a PVD process.

Figure 14:
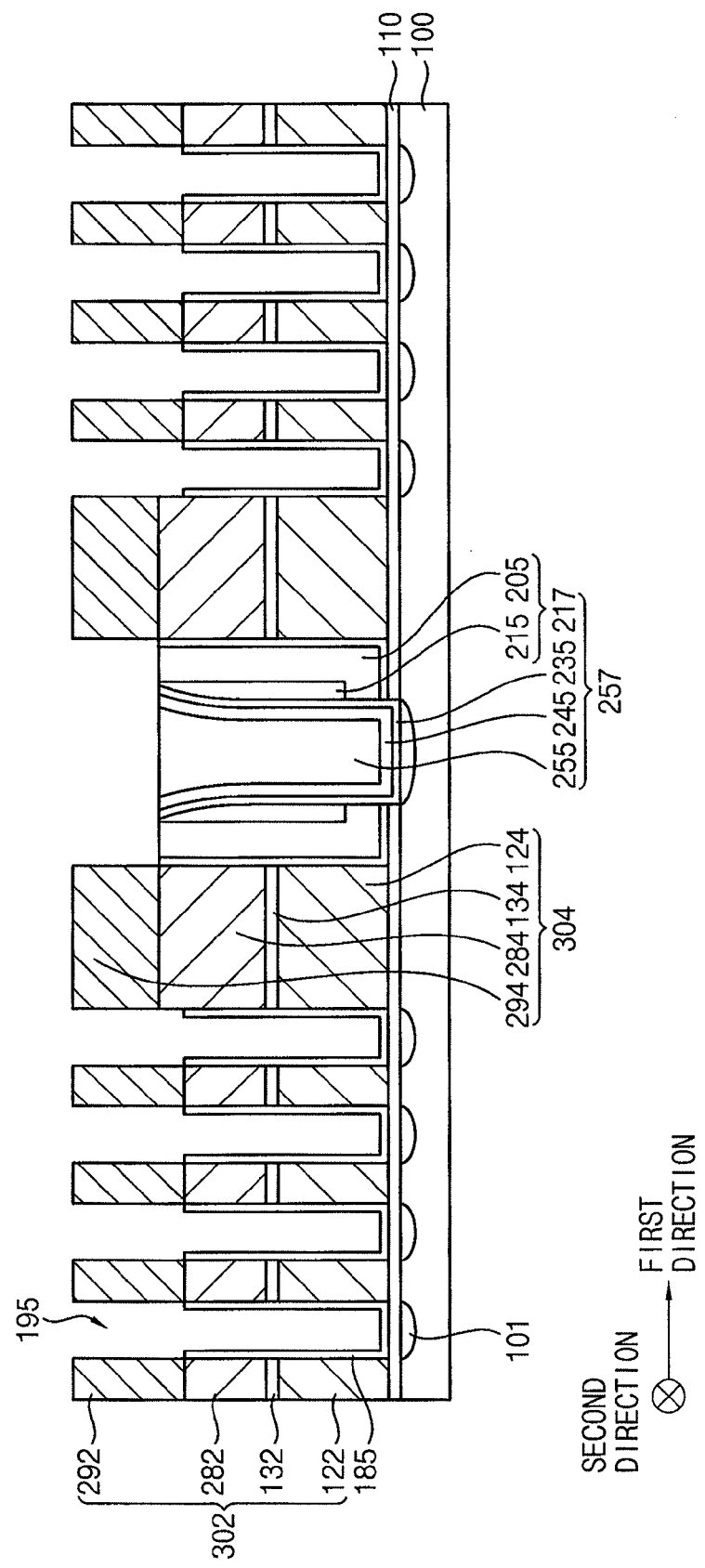

Referring to FIG. 14, the exposed portions of the preliminary control gates 142 and 144 may be reacted with the first conductive layer 270 formed thereon to form first and second upper conductive patterns 292 and 294, respectively. Portions of the preliminary control gates 142 and 144 that are not reacted with the first conductive layer 270, i.e., unexposed portions of the preliminary control gates 142 and 144 that are coated with the first insulation layer pattern 185, may be defined as first and second lower conductive patterns 282 and 284, respectively. The first and second upper conductive patterns 292 and 294 together with the first and second lower conductive patterns 282 and 284 may define first and second control gates, respectively.

In detail, portions of the preliminary control gates 142 and 144 including doped polysilicon and directly contacting the first conductive layer 270, i.e., exposed portions of the preliminary control gates 142 and 144, may interact with the first conductive layer 270, i.e., a layer including metal, to form a metal silicide layer. The silicidation process may be performed by a heat treatment. As such, the resultant metal silicide layer may exhibit lower resistance, as compared to a metal layer. In other words, the first and second control gates that include respective first and second upper conductive patterns 292 and 294, which are formed of metal silicide, may exhibit lower resistance than control gates having metal conductive patterns without silicide portions.

For example, when the first conductive layer 270 includes cobalt, the resultant first and second upper conductive patterns 292 and 294 may include cobalt silicide, and may be formed to have a bottom surface substantially coplanar with a top surface of the first insulation layer pattern 185. In another example, when the first conductive layer 270 includes nickel, the resultant first and second upper conductive patterns 292 and 294 may include nickel silicide, and may be formed to have a bottom surface lower than a top surface of the first insulation layer pattern 185 relative to a top surface of the respective first and second upper conductive patterns 292 and 294.

In the present embodiment, metal of the first conductive layer 270 may be reacted with silicon of the preliminary control gates 142 and 144 to form a metal silicide layer, however, other types of reaction may also occur. For example, the material of the first conductive layer 270 may be adjusted, so a reaction between the first conductive layer 270 and the exposed portions of the preliminary control gates 142 and 144 may improve the characteristics, e.g., low resistance characteristics, of the preliminary control gates 142 and 144. Further, any such reaction is within the scope of the present inventive concept. Further, not only a conductive layer but also an insulating layer may be formed on the preliminary control gates 142 and 144, if an interaction between the insulating layer and the preliminary control gates 142 and 144 may improve the characteristics of the preliminary control gates 142 and 144. In this respect, the first conductive layer 270 and the first insulation layer pattern 185 may serve as a reaction layer and a reaction prevention layer, respectively.

By the silicidation process, a plurality of first gate structures 302, i.e., each of which may include a first floating gate 122, a first dielectric layer pattern 132 and a first control gate 282 and 292, and a plurality of second gate structures 304, i.e., each of which may include a second floating gate 124, a second dielectric layer pattern 134 and a second control gate 284 and 294, may be formed. Alternatively, when the third and fourth preliminary gate structures 172 and 174 are defined to include the first and second tunnel insulation layer patterns 112 and 114, third and fourth gate structures (not shown) including first and second tunnel insulation layer patterns 112 and 114 may be defined. Two second gate structures 304 and a plurality of first gate structures 302 between the second gate structures 304 may define a string.

In example embodiments, each first control gate 282 and 292 of each first gate structure 302 may serve as a word line, and each second control gate 284 and 294 of each second gate structure 304 may serve as a string selection line (SSL) or a ground selection line (GSL).

Portions of the first conductive layer 270 that are not reacted with the preliminary control gates 142 and 144 and the sacrificial layer pattern 265 may be removed, e.g., by a stripping process using sulfuric acid to form second openings 195 between the gate structures 302 and 304.

Figure 15:
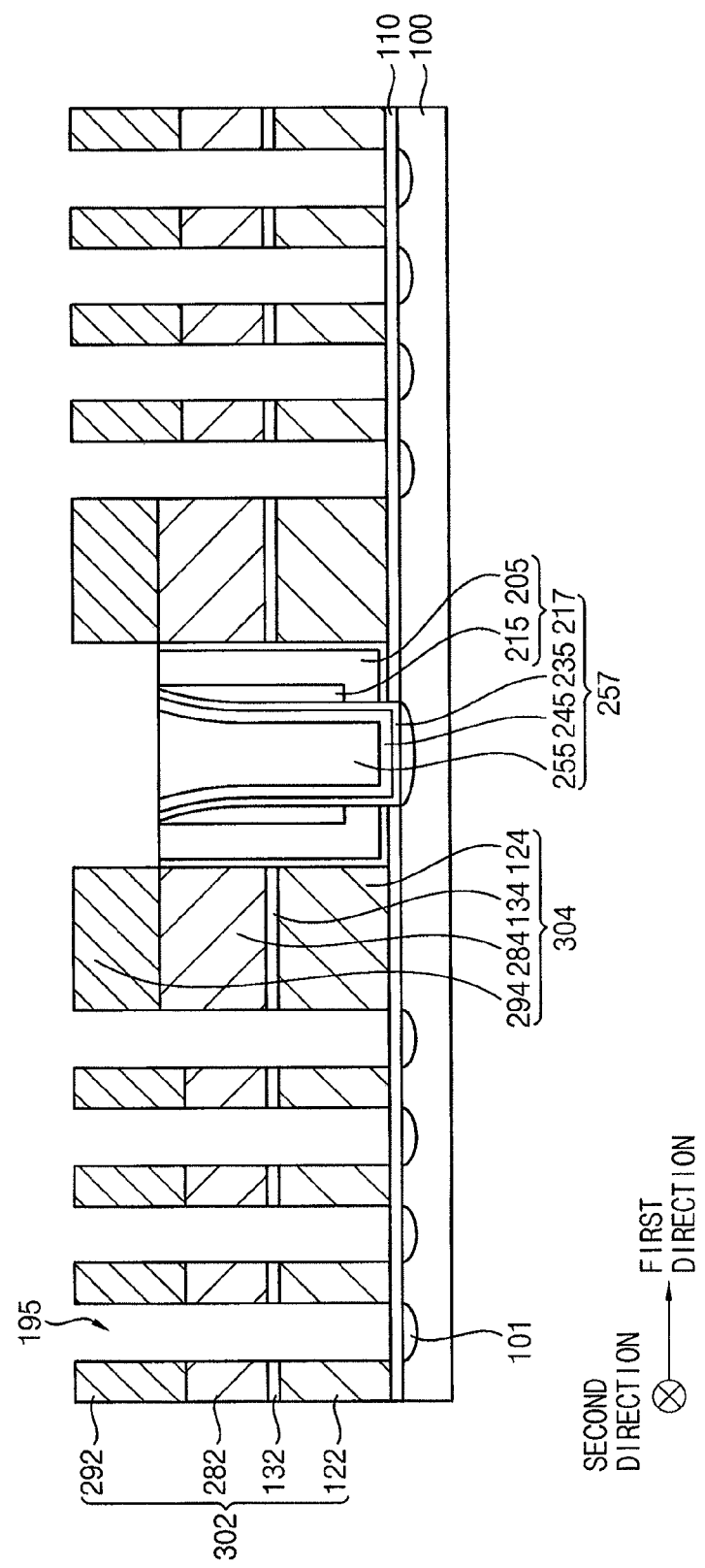

Referring to FIG. 15, portions of the first insulation layer pattern 185 exposed by the sacrificial layer pattern 265 in the openings 193 may be removed. For example, as illustrated in FIG. 15, portions of the first insulation layer pattern 185 on sidewalls of the first gate structures 302, a sidewall of each second gate structure 304, a top surface of the substrate 100 between the first and second gate structures 302 and 304 may be completely or substantially completely removed. In example embodiments, the first insulation layer pattern 185 may be removed using a solution including hydrogen fluoride (HF).

Figure 16:
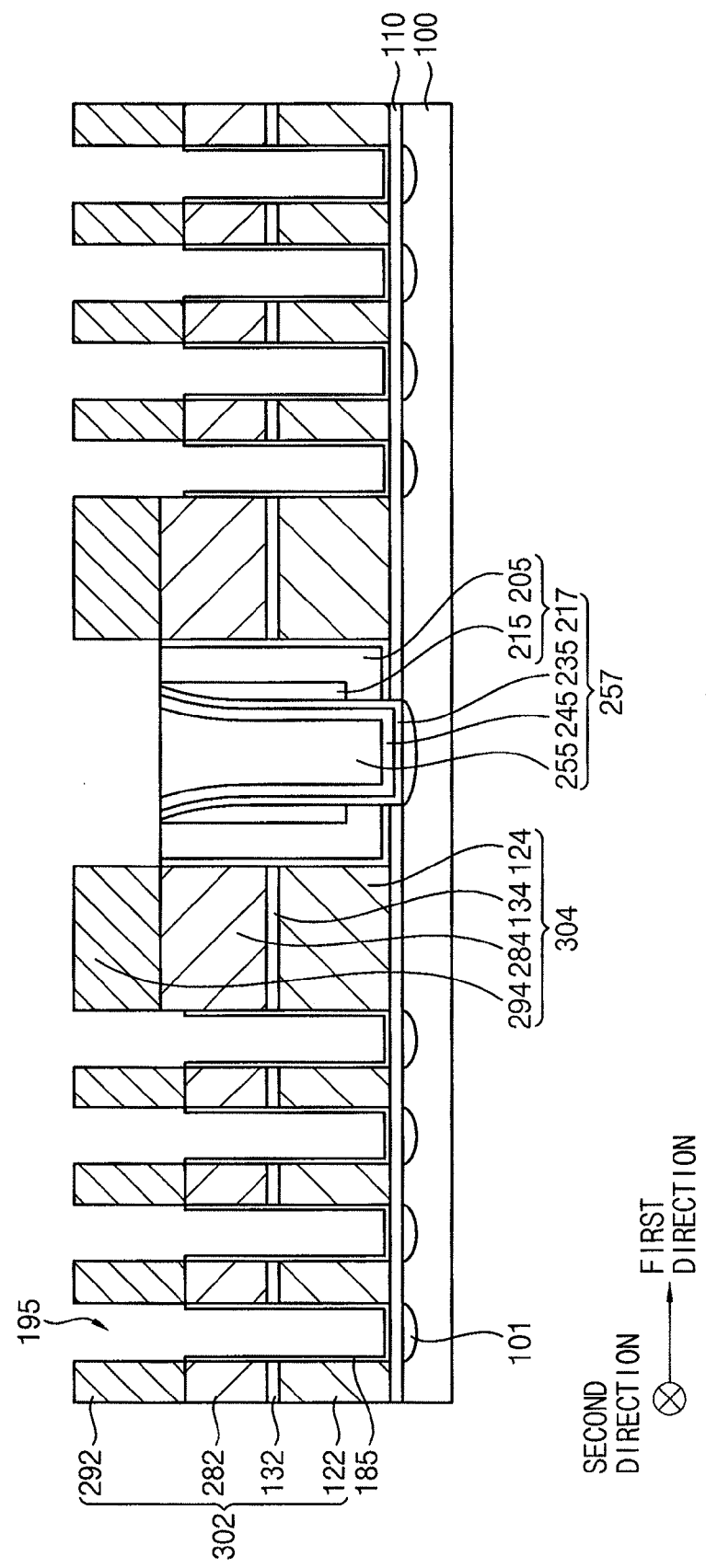

In another example, as illustrated in FIG. 16, portions of the first insulation layer pattern 185 on sidewalls of the first gate structures 302, a sidewall of each second gate structure 304, a top surface of the substrate 100 between the first and second gate structures 302 and 304 may be partially removed. Thus, a first insulation layer pattern 185 having a reduced thickness may remain.

Figure 17:
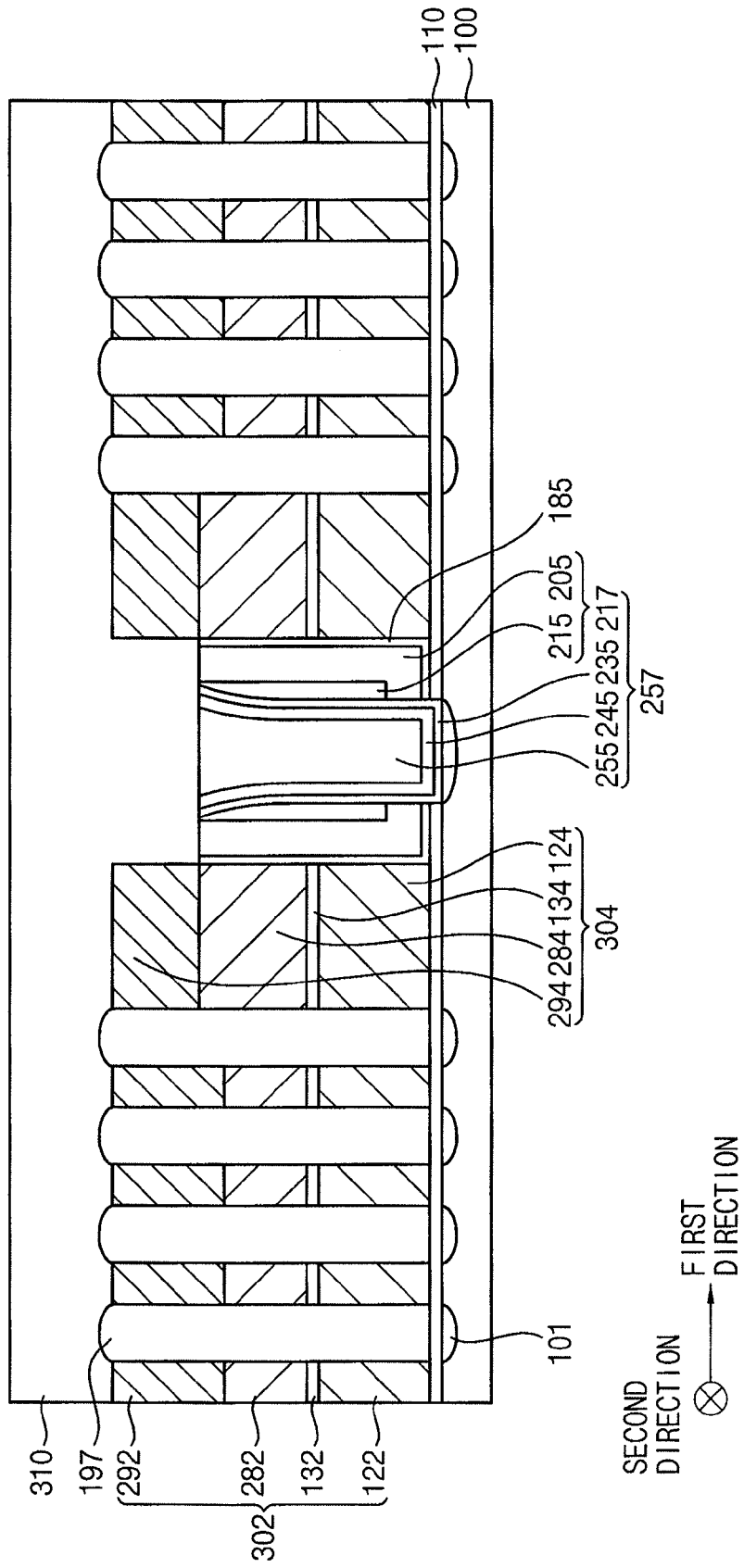

Referring to FIG. 17, a capping layer 310 may be formed on the substrate 100 to cover the gate structures 302 and 304, the insulation layer structure 257, and the first insulation layer pattern 185 to form second air gaps 197 between the gate structures 302 and 304. For example, a second air gap 197 may be enclosed among two adjacent gate structures 302, the capping layer 310, and the substrate. Similarly, a second air gap 197 may be enclosed among an outermost gate structure 302, the gate structure 304, the capping layer 310, and the substrate 100.

In example embodiments, the capping layer 310 may be formed using a silicon oxide, e.g., PEOX or MTO by a CVD process, a PECVD process, an LPCVD process, etc. The capping layer 310 may be formed using a material having poor step coverage so that the second air gaps 197 may be formed thereunder.

Figure 18:
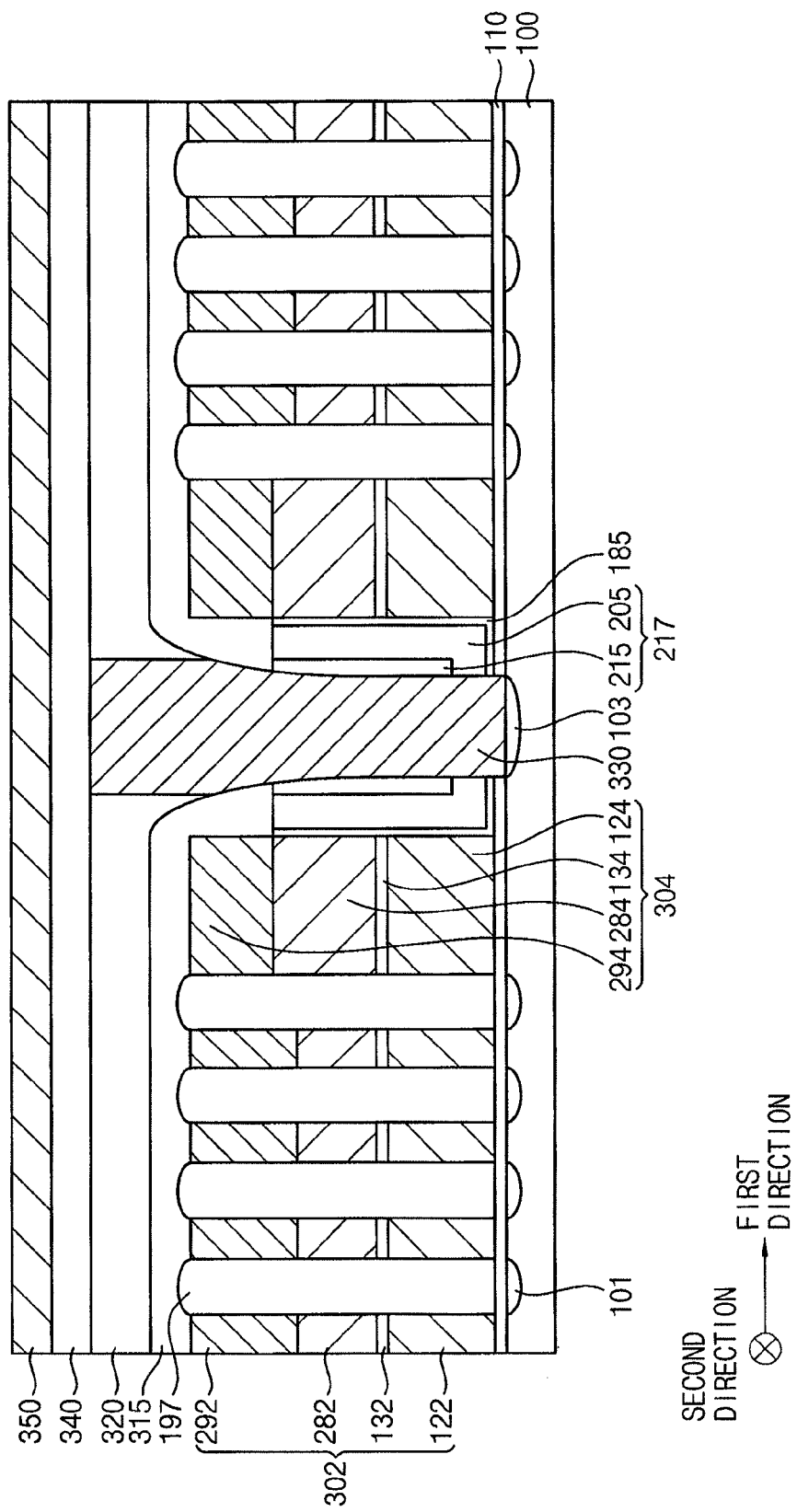

Referring to FIG. 18, the capping layer 310, the insulation layer structure 257, and the tunnel insulation layer 110 may be partially removed to expose the second impurity region 103 of the substrate 100. Thus, the capping layer 310 may be transformed into a capping layer pattern 315. In example embodiments, the first insulating interlayer 255, the etch stop layer pattern 245, and the buffer layer pattern 235 in the insulation layer structure 257 may be removed.

A second insulating interlayer 320 may be formed on the capping layer pattern 315 and the substrate 100, and a third opening (not shown) exposing the second impurity region 103 may be formed through the second insulating interlayer 320. A common source line (CSL) 330 may be formed on the second impurity region 103 to fill the third opening. The second insulating interlayer 320 may be formed using an oxide, e.g., BPSG, USG, SOG, etc. The CSL 330 may be formed using doped polysilicon, a metal or a metal silicide.

A third insulation layer 340 may be formed on the second insulation layer 320 and the CSL 330. The third insulation layer 340 may be formed using an oxide, e.g., BPSG, USG, SOG, etc. A bit line contact (not shown) may be formed through the second and third insulating interlayers 320 and 340. The bit line contact may be formed using a metal, doped polysilicon, etc. A bit line 350 may be formed on the third insulation layer 340 to be electrically connected to the bit line contact. The bit line 350 may be formed to extend in the first direction. The bit line 350 may be formed using a metal, doped polysilicon, etc.

By the above processes, the semiconductor device in accordance with example embodiments may be manufactured. In FIGS. 1 to 18, a method of manufacturing a NAND flash memory device is illustrated, however, the present inventive concept may be applied to other types of memory devices, e.g., NOR flash memory devices, DRAM devices, etc.

In the method of manufacturing the semiconductor device, the insulation layer structure 257 may be formed between adjacent second preliminary gate structures 164, i.e., between second preliminary gate structures 164 of adjacent strings. A distance between the adjacent second preliminary gate structures 164 may be larger than a distance between adjacent first preliminary gate structures 162 or a distance between an outermost first preliminary gate structure 162 and an adjacent second preliminary gate structure 164. Thus, the first insulation layer 180 serving as a reaction prevention layer for preventing silicidation of the preliminary gate structures 162 and 164 may be protected. Accordingly, the gate structures 302 and 304 may be formed to have low resistance, and the second air gaps 197 formed between adjacent first gate structures may reduce parasitic capacitance between the adjacent first gate structures, which are spaced apart from each other relatively closely.

Figure 19:
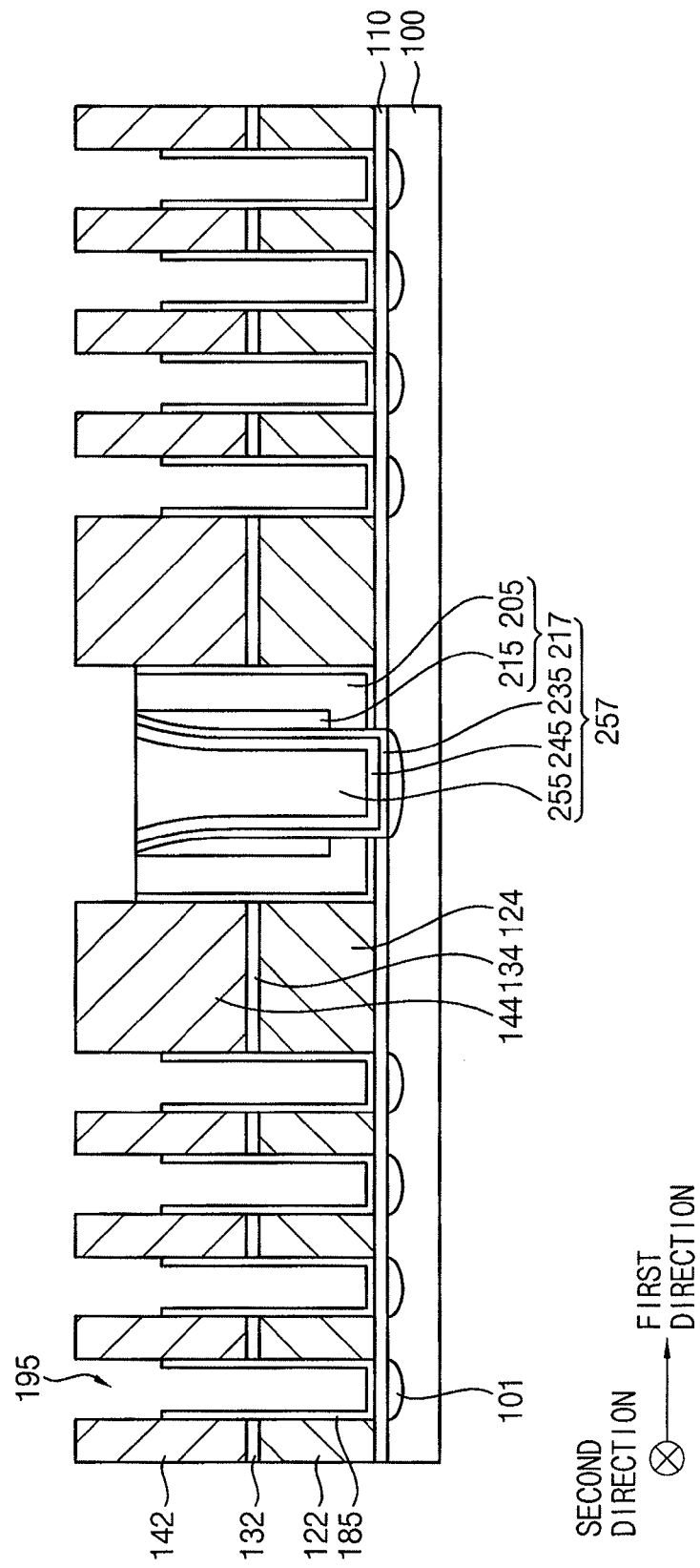
FIGS. 19 to 20 illustrate cross-sectional views of stages in a method of manufacturing a semiconductor device in accordance with other example embodiments.
Figure 20:
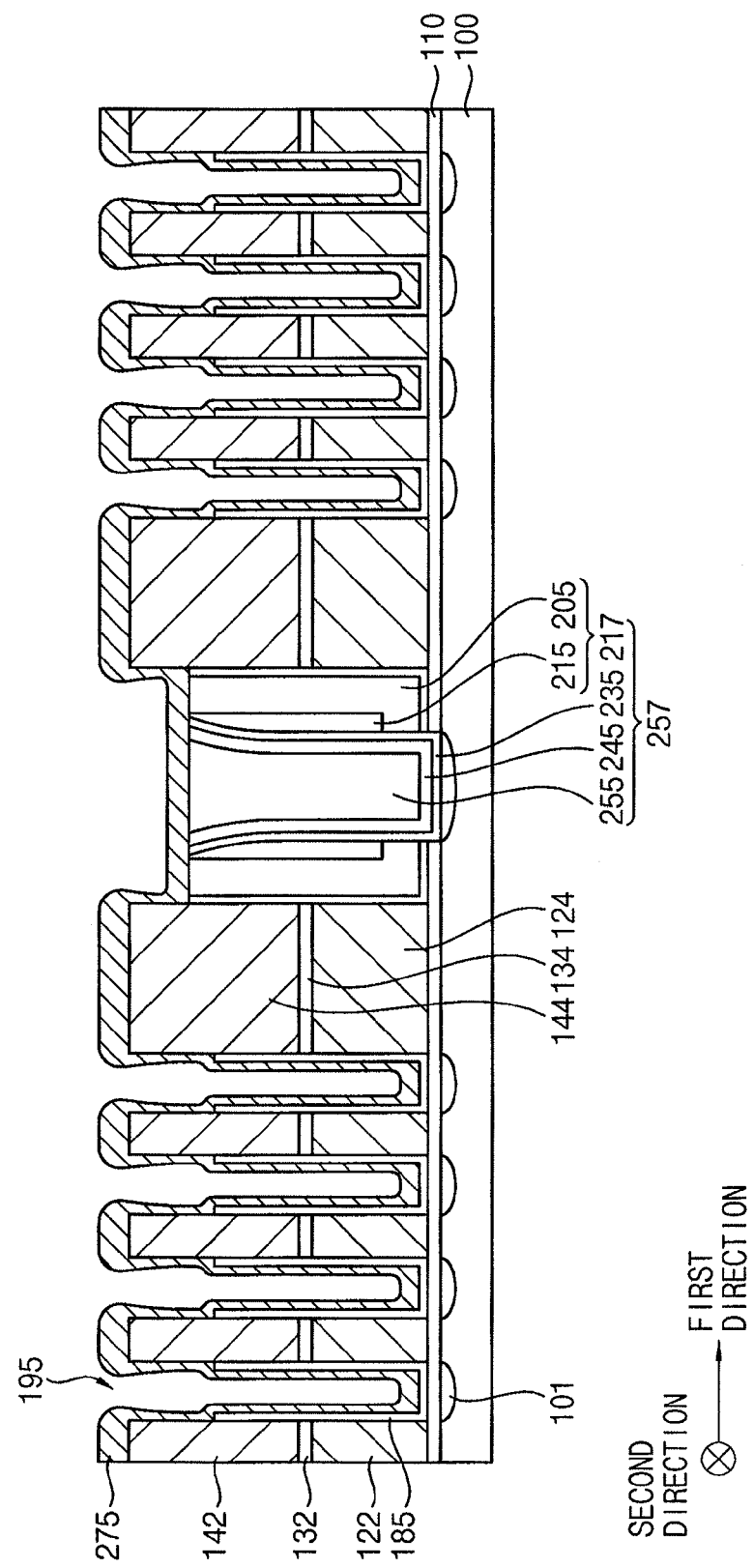

FIGS. 19 to 20 are cross-sectional views of stages in a method of manufacturing a semiconductor device in accordance with other example embodiments. The method may be substantially the same as or similar to that illustrated with reference to FIGS. 1 to 18, except for the order of forming a conductive layer and removing a sacrificial layer pattern. Thus, detailed explanations of same elements are omitted.

First, processes substantially the same as or similar to those illustrated with reference to FIGS. 1 to 12 may be performed.

Referring to FIG. 19, the sacrificial layer pattern 265 may be removed from the first openings 193 to expose the first insulation layer pattern 185 and to form the second openings 195. In example embodiments, the sacrificial layer pattern 265 may be removed by a stripping process using sulfuric acid.

Referring to FIG. 20, a second conductive layer 275 may be formed on the exposed upper portions of the preliminary control gates 142 and 144, the insulation layer structure 257, and the exposed first insulation layer pattern 185. In example embodiments, the second conductive layer 275 may be formed using a metal, e.g., cobalt, nickel, etc. by a PVD process.

Referring to FIG. 14 again, the exposed portions of the preliminary control gates 142 and 144 may be reacted with the second conductive layer 275 to form first and second upper conductive patterns 292 and 294, respectively. Portions of the second conductive layer 275 that are not reacted with the preliminary control gates 142 and 144 may be removed, e.g., by a stripping process using sulfuric acid. Processes substantially the same as or similar to those illustrated with reference to FIGS. 15 to 18 may be performed to manufacture the semiconductor device.

According to example embodiments, an insulation layer structure may be formed between second preliminary gate structures spaced apart from each other a larger distance than that between first preliminary gate structures. Therefore, a first insulation layer serving as a reaction prevention layer for preventing silicidation of the preliminary gate structures may be protected. Accordingly, not only gate structures having low resistance may be formed, but also air gaps may be formed between the first gate structures spaced apart from each other relatively closely, thereby reducing parasitic capacitance. Further, the method according to example embodiments provides an efficient way of forming a desired size of air gaps between word lines, i.e., gate structures, spaced apart from each other at different distances.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a plurality of preliminary strings spaced apart a first distance from each other on a substrate, each of the preliminary strings including a plurality of first preliminary gate structures spaced apart a second distance from each other between second preliminary gate structures, the first distance being greater than the second distance;

forming a first insulation layer on the substrate to cover the first and second preliminary gate structures;

forming an insulation layer structure on the first insulation layer, such that the insulation layer structure fills a space between the preliminary strings;

forming a sacrificial layer pattern on the first insulation layer, such that the sacrificial layer pattern partially fills spaces between adjacent ones of the first and second preliminary gate structures;

removing a portion of the first insulation layer not covered by the sacrificial layer pattern to form a first insulation layer pattern;

reacting portions of the first and second preliminary gate structures not covered by the first insulation layer pattern with a conductive layer to form first and second gate structures, respectively; and forming a capping layer on the first and second gate structures, such that air gaps are formed between the first and second gate structures.

2. The method as claimed in claim 1, wherein forming the insulation layer structure includes:
   forming a second insulation layer on the first insulation layer, such that the second insulation layer covers top surfaces of the first and second preliminary gate structures and a sidewall of the space between the preliminary strings;
   partially removing the second insulation layer to form a second insulation layer pattern covering the top surfaces of the first preliminary gate structures and partially covering the top surfaces of the second preliminary gate structures, such that a spacer is formed on the sidewall of the space between the preliminary strings;
   forming an insulating interlayer on the second insulation layer pattern and the spacer, such that the space between the preliminary strings is filled; and
   planarizing upper portions of the insulating interlayer and the second insulation layer pattern.

3. The method as claimed in claim 2, further comprising, prior to partially removing the second insulation layer, forming a third insulation layer on the second insulation layer.

4. The method as claimed in claim 3, wherein partially removing the second insulation layer includes:
   forming a mask on the third insulation layer, the mask overlapping portions of the second preliminary gate structures and the first preliminary gate structures; and
   removing the second and third insulation layers using the mask as an etching mask.

5. The method as claimed in claim 3, wherein forming the second insulation layer includes using a material having gap filling characteristics lower than that of the third insulation layer.

6. The method as claimed in claim 5, wherein forming the second insulation layer includes using PEOX or MTO, and forming the third insulation layer includes using HTO.

7. The method as claimed in claim 2, further comprising, prior to forming the insulating interlayer, conformally and sequentially forming a buffer layer and an etch stop layer on the second insulation layer pattern.

8. The method as claimed in claim 7, wherein forming the buffer layer includes using an oxide, and forming the etch stop layer includes using silicon nitride.

9. The method as claimed in claim 7, wherein planarizing the upper portions of the insulating interlayer and the second insulation layer pattern includes:
   planarizing the insulating interlayer and the etch stop layer until the second insulation layer pattern is exposed; and
   removing the second insulation layer pattern, the insulating interlayer, the etch stop layer, the buffer layer, and the first insulation layer until top surfaces of the first preliminary gate structures are exposed.

10. The method as claimed in claim 9, wherein removing the second insulation layer pattern, the insulating interlayer, the etch stop layer, the buffer layer, and the first insulation layer includes:
    providing ammonia gas onto the substrate; and
    performing a heat treatment on the substrate.

11. The method as claimed in claim 1, wherein forming the sacrificial layer pattern includes:
    forming a sacrificial layer on the first insulation layer and the insulation layer structure to fill spaces between the preliminary gate structures; and
    partially removing the sacrificial layer until a top surface of the insulation layer structure and sidewalls of the preliminary gate structures are exposed.

12. The method as claimed in claim 1, wherein forming the first insulation layer pattern includes:
    providing ammonia gas onto the substrate; and
    performing a heat treatment on the substrate.

13. The method as claimed in claim 1, wherein forming the first and second gate structures includes:
    forming a metal layer on the preliminary gate structures, the sacrificial layer pattern, the first insulation layer pattern, and the insulation layer structure; and
    performing a heat treatment on the substrate to react the preliminary gate structures with the metal layer.

14. The method as claimed in claim 13, further comprising:
    forming a tunnel insulation layer on the substrate, each first preliminary gate structure including a first floating gate, a first dielectric layer pattern, and a first preliminary control gate sequentially stacked on the tunnel insulation layer, and each second preliminary gate structure includes a second floating gate, a second dielectric layer pattern, and a second preliminary control gate sequentially stacked on the tunnel insulation layer,
    wherein the first and second preliminary control gates include polysilicon, and
    wherein portions of the first and second preliminary control gates are silicidated by the heat treatment.

15. The method as claimed in claim 13, further comprising, after forming the first and second gate structures, removing the sacrificial layer pattern.

16. A method of manufacturing a semiconductor device, the method comprising:
    forming a plurality of preliminary strings spaced apart a first distance from each other on a substrate, each of the preliminary strings including a plurality of first preliminary gate structures spaced a second distance from each other between second preliminary gate structures, the first distance being greater than the second distance;
    forming a first insulation layer on lower sidewalls and bottoms of openings between adjacent ones of the first and second preliminary gate structures;
    forming an insulation layer structure on the first insulation layer between the preliminary strings;
    forming a conductive layer directly on upper portions of the first and second preliminary gate structures to form first and second gate structures, respectively, the upper portions of the first and second preliminary gate structures being exposed to said conductive layer by the first insulation layer; and forming a capping layer on the first and second gate structures, such that air gaps are formed within each string between adjacent ones of the first and second gate structures.

17. The method as claimed in claim 16, wherein forming the first insulation layer on lower sidewalls includes:

conformally forming the first insulation layer on the first and second preliminary gate structures;

forming a sacrificial layer pattern on the first insulation layer in each preliminary string, such that the sacrificial layer pattern partially fills spaces between adjacent ones of the first and second preliminary gate structures within each preliminary string; and removing upper portions of the first insulation layer within each string, such that a top part of each first and second preliminary gate structures is exposed.

18. The method as claimed in claim 16, wherein forming the insulation layer structure includes completely filling a space between the preliminary strings.

19. The method as claimed in claim 16, wherein forming the conductive layer includes conformally depositing a metal layer on the upper portions of the first and second preliminary gate structures including silicon, such that the upper portions of the first and second preliminary gate structures undergo a silicidation process.

20. The method as claimed in claim 16, further comprising, before forming the capping layer, removing the first insulating layer from the first and second gate structures.

* * * * *